United States Patent
Liu et al.

(10) Patent No.: US 7,129,026 B2
(45) Date of Patent: Oct. 31, 2006

(54) LITHOGRAPHIC PROCESS FOR MULTI-ETCHING STEPS BY USING SINGLE RETICLE

(75) Inventors: Da-Yo Liu, Taipei (TW); Chin-Tzu Kao, Changhua County (TW); Jui-Chung Chang, Taichung County (TW); Yi-Tsai Hsu, Taoyuan County (TW)

(73) Assignee: Chungwha Picture Tubes, Ltd., Taipei (TW)

( * ) Notice: Subject to any disclaimer, the term of this patent is extended or adjusted under 35 U.S.C. 154(b) by 126 days.

(21) Appl. No.: 10/366,089

(22) Filed: Feb. 12, 2003

(65) Prior Publication Data
US 2004/0157166 A1   Aug. 12, 2004

(30) Foreign Application Priority Data
Feb. 11, 2003   (TW) .............................. 92102802 A

(51) Int. Cl.
*G03C 5/00*   (2006.01)
(52) U.S. Cl. ...................... 430/316; 430/317; 430/318; 430/311

(58) Field of Classification Search ................ 430/320, 430/322, 5; 438/149, 158
See application file for complete search history.

(56) References Cited

U.S. PATENT DOCUMENTS

| | | | | |
|---|---|---|---|---|
| 5,223,083 | A * | 6/1993 | Cathey et al. | 438/701 |
| 6,255,130 | B1 * | 7/2001 | Kim | 438/30 |
| 6,352,818 | B1 * | 3/2002 | Hsieh | 430/322 |
| 6,608,658 | B1 * | 8/2003 | Tsujimura et al. | 349/110 |
| 6,643,008 | B1 * | 11/2003 | Stirton et al. | 356/237.5 |

* cited by examiner

*Primary Examiner*—John A. McPherson
*Assistant Examiner*—Daborah Chacko-Davis
(74) *Attorney, Agent, or Firm*—Perkins Coie LLP

(57) ABSTRACT

This invention provides a lithographic process for multi-etching steps by using single reticle, wherein the develop step is performed next to a bake step after the photoresist layer has been exposed, such that a photoresist residue is formed on the peripheral region around a transformed pattern of the photoresist. Because the photoresist residue has thinner thickness compared to the photoresist layer, this kind of developed photoresist layer can be used as the very mask for multi-etching steps.

11 Claims, 6 Drawing Sheets

LITHOGRAPHIC PROCESS FOR MULTI-ETCHING STEPS BY USING SINGLE RETICLE

CROSS REFERENCE TO RELATED APPLICATIONS

This application claims the benefit of Taiwanese Patent Application No. 092102802 filed on Feb. 11, 2003, which is hereby incorporated by reference in its entirety.

TECHNICAL FIELD

The present invention generally relates to a lithographic process, and more particularly to a lithographic process for multi-etching steps by using single reticle.

BACKGROUND

In conventional manufacturing liquid crystal display device process, lithographic process is a crucial step with high cost and high precise control. Array process with lithographic process is the most critical step particularly for liquid crystal display device for extremely large numbers of tiny thin film transistors are simultaneously formed on a huge substrate. Hence, decreased numbers of lithographic processes can promote manufacturing yield of liquid crystal display devices and reduce capitalized cost. From the array manufacturing process with six lithographic processes in former times to nowadays four lithographic processes, manufacturing cost of reticle and exposure times can be decreased when at least one reticle in lithographic process is reduced, and the necessary high precision steps can be reduced to progress product yield. Therefore, many researches and studies are focused on the reduction of reticles, and published many papers and patents.

Generally, the four lithographic processes can be applied to the manufacturing array process, because one reticle as well as one exposure process is used for two etching processes in which two patterns generated by the two etching processes are highly similar. A typical method is to use a reticle with optical correction such that photoresist layer after developed will generate different thickness, and thinner portion of this photoresist layer will be removed at followed etching steps to create masks with different patterns. Therefore, masks with different patterns by using one reticle and one exposure process can be implemented by using multi-etching process to replace original two masks by using two reticles and two lithographic processes.

One optical correction reticle is provided by Samsung. Slit structure is used in reticle design to make a portion of photoresist layer half tone at exposure in lithographic processes of thin film transistor array. Photoresist residue is formed in the half tone region due to insufficient exposure after developed. Thickness of the photoresist residue is thinner than typical photoresist layer, and then will be removed at some etching stage of following multi-etching process. Pattern of the photoresist mask is changed when the photoresist residue is removed, and two patterns of photoresist mask by using one reticle as well as one exposure step is implemented.

Another method for forming photoresist residue is to use reticle with different light transmissions. A lower transmission reticle is used at the region where photoresist residue is desired to be formed, and then the photoresist residue after developed is formed at the region of photoresist layer without sufficient exposure.

Another method again for forming photoresist residue is to use reticle with phase shift mask correction. The reticle with phase shift portion will generate destructive interference on the photoresist layer during exposure to result insufficient exposure at the desired region, and then photoresist residue is formed after developed.

However, the above mentioned lithographic processes all utilizes steps which development is after exposure and before baking step. The baking step after development will make profile of the photoresist layer deforms, and such deformed photoresist layer will make the following etching process fail.

Moreover, the reticles, no matter slit structure, varying transmission rate reticle, or phase shift mask, all are using optical correction. Nevertheless, reticles with optical correction will greatly increase manufacturing cost thereof. Using reticles with massive areas is an inevitable way especially for liquid crystal display device manufacturing from fourth generation to fifth generation, even to sixth generation, process. It is very difficult that extremely precise optical corrections are used in such a huge reticle and all optical corrections need to be identical everywhere. Hence, manufacturing yield of reticles is decreased significantly and even impractical.

Even though the above lithographic process can be implanted, other regions will be over etched at the following multi-etching steps to change patterns. A significant situation is that data line is opened at the mulit-etching steps.

Therefore, it is an important issue to provide another lithographic process for single reticle with multi-etching steps to preserve profile of developed photoresist layer and to generate a reticle with high production yield and lower cost.

SUMMARY

In accordance with the present invention, a lithographic process is provided for multi-etching steps by using single reticle in which develop step is after baking step to preserve profile of the photoresist layer.

It is another object of this invention that reticle without any optical correction is applied to this invention to reduce manufacturing cost thereof and increase production yield thereof.

It is a further object of this invention that the lithographic process can prevent from data line opening at multi-etching steps when applied to the thin film transistor array process in liquid crystal display device manufacturing process.

In one embodiment, a lithographic process for multi-etching steps by using single reticle is provided which comprises a step of exposing a photoresist layer on a substrate with a reticle and then baking the photoresist layer immediately without development. Then, photoresist residue is formed around patterned photoresist layer at a step of developing the photoresist layer, wherein thickness of the photoresist residue is thinner than the photoresist layer. The reticle does not use any optical correction.

A method for simultaneously forming semiconductor layer and source/drain regions by using single reticle for multi-etching steps in formation of thin film transistors array is also provided, and the method comprises a step of selectively forming a gate electrode layer on a substrate. Then, a dielectric layer, a semiconductor layer, and a conductive layer are subsequently formed on the gate electrode layer and substrate. Next, a photoresist layer is formed on the conductive layer. The photoresist layer is exposed by using a reticle, wherein the reticle has a pattern without any optical correction. Afterward, the photoresist layer is baked and then developed such that a patterned photoresist layer covered by the pattern is formed, a photoresist residue around the patterned photoresist layer is formed, and the other region of the photoresist layer is removed. Then, a first step of etching the conductive layer by using the patterned photoresist layer is performed, and a first step of etching the semiconductor layer by using the patterned photoresist layer is performed in which the photoresist residue is removed to form an island semiconductor layer. Next, a second step of etching the conductive layer is performed to form a source region and a drain region and a second step of etching the semiconductor layer is performed to form a channel region. The photoresist layer is finally removed completely.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Some sample embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
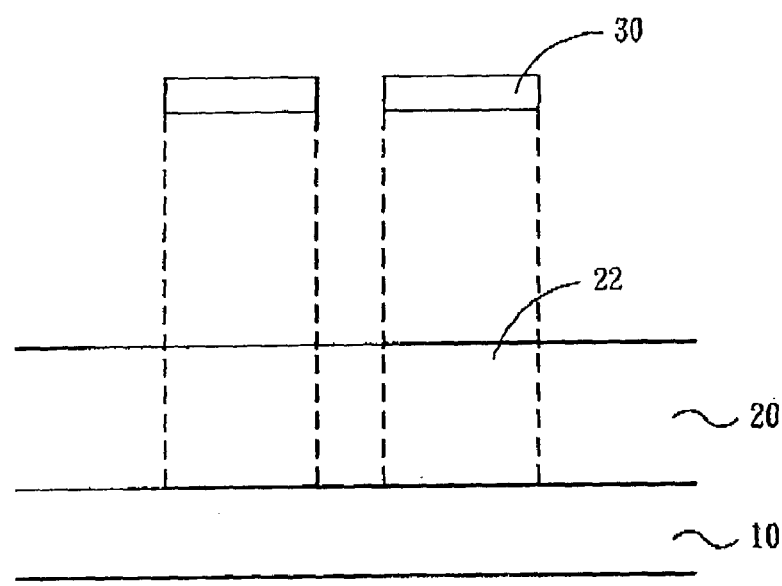
FIG. 1 illustrates a schematic representation of lithographic process for multi-etching steps by using single reticle in accordance with this invention, wherein a photoresist layer is exposed by a reticle.

Referring to FIG. 1, a photoresist layer 20 is formed on a substrate. The photoresist layer 20 is mixed by resin as a binder, sensitizer, and solvent, in which the sensitizer is a high photoactivity compound and has content about equal to the resin in photoresist. The resin and sensitizer are solved in the solvent such that photoresist is in liquid state to put it to good account. If the photoresist per se is hard to dissolve in developer, but easy to dissolve to a decomposition structure in the developer after exposure, this kind of photoresist is called positive photoresist. Formation method of photoresist layer 20 is spin-on-coating in this embodiment. Having forming the photoresist layer 20 on the substrate, a soft bake, or pre-exposure bake, is performed. The aim of this soft bake is to remove solvent in the photoresist layer 20 from liquid state to close to solid state and to enhance adhesive strength photoresist layer 20.

Then, a reticle 30 without any optical correction is used as a mask to the photoresist layer 20 in an exposure process. In this embodiment, patterned region 22 of the photoresist layer 20 is covered by the reticle 30 due to positive photoresist is used. However, negative photoresist can also be used in this invention. Transparent material, such as glass or quartz, is used for the reticle 30, and an opaque metal chromium film with pattern(s) is formed thereon.

A significant feature of this invention is to bake photoresist layer 20 after the exposure directly, and then develop step is followed. This bake step is called hard bake, and aim of this bake step is to further reduce solvent content in the photoresist layer 20 and to enhance hardness thereof to increase resistance ability in the following etching steps. This baking step has higher temperature than the above soft bake and makes the photoresist layer 20 deformation.

Figure 2:
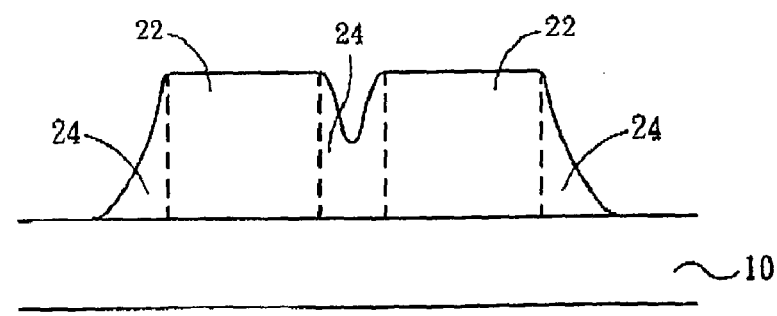
FIG. 2 illustrates a schematic representation of lithographic process for multi-etching steps by using single reticle in accordance with this invention, wherein photoresist residue is formed around the patterned region after baking and developing.

The photoresist layer 20 after exposed will generate an acid, and will be neutralized and removed out when a base developer is added in. A normal develop step is before hard bake because photoresist after exposure needs to be developed as soon as possible to prevent from decreasing resolution due to time delay. In this invention, resolution of development of the photoresist layer 20 is decreased substantially due to develop step is after hard bake step. Photoresist residue is therefore reserved around unexposed region, or patterned region, of the photoresist layer after development. Referring to FIG. 2, photoresist residue 24 is formed near the patterned region 22 after the photoresist layer 20 is developed. Thickness of the photoresist residue is thinned than the patterned region 22 of the photoresist layer 20. This kind of different thickness photoresist layer 20 will generate different etching masks for the below substrate 10 to be etched at the following multi-etching steps.

The advantage of this lithographic process is to keep photoresist profile for no baking process after development. Hence, followed etching steps will not be failed easily to promote yield. Moreover, reticle's pattern does not need any optical correction to reduce reticle-manufacturing complexity substantially, and reticle-manufacturing cost can be down to about 50%.

This inventive lithographic process, when applied to array manufacturing process in thin film transistors liquid crystal display device, can lower manufacturing cost and increase product yield substantially. Therefore, this invention also provides a method for simultaneously forming semiconductor layer and source/drain regions by using single reticle for multi-etching steps in formation of thin film transistors array, which comprises a step of selectively forming a gate electrode layer on a substrate. Then, a dielectric layer, a semiconductor layer, and a conductive layer are formed on the gate electrode layer and substrate. Next, a photoresist layer is formed on the conductive layer. An exposure step is performed with a reticle to the photoresist layer, in which the reticle has a pattern without any optical correction. Afterward, the photoresist layer is baked, and then developed such that a patterned photoresist layer covered by the pattern is formed, a photoresist residue around the patterned photoresist layer is formed, and the other region of the photoresist layer is removed. A first etching step to the conductive layer is performed by using the patterned photoresist layer as a mask. Next, a first etching step to the semiconductor layer is performed by using the patterned photoresist layer as a mask to form an island semiconductor layer and the photoresist residue is removed simultaneously. Then, a second etching step to the conductive layer is performed to form a source region and a drain region. Next, a second etching step to the semiconductor layer is performed to form a channel region. The photoresist layer is then removed out.

Thickness of the photoresist residue is thinner than the patterned photoresist layer, so such kind of patterned photoresist layer with residue can be applied to mask for multi-etching steps. The first etching step to the conductive layer is a high etching selectivity ratio, and wet etching is preferable. The first etching to the semiconductor layer is anisotropical etching, and dry etching is preferable. Further, the photoresist residue is removed out by oxygen plasma ashing. The second etching step to the conductive layer is conducted by using high etching selectivity ratio, and the second etching step to the semiconductor layer is conducted by anisotropical etching step.

The above method for simultaneously forming semiconductor layer and source/drain regions by using single reticle for multi-etching steps in formation of thin film transistors array will be set forth with references to the figures.

Figure 3:
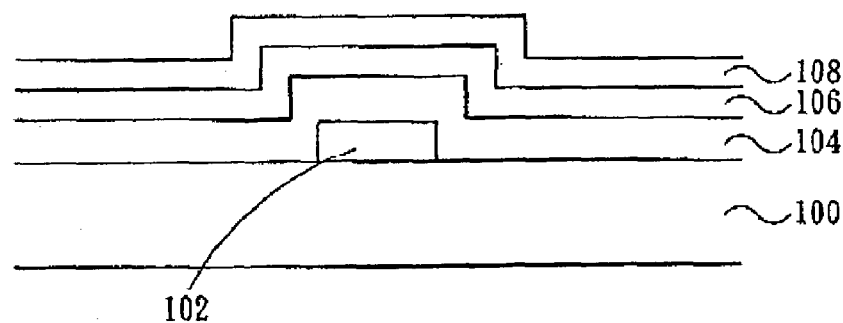
FIG. 3 illustrates a schematic representation of lithographic process for multi-etching steps by using single reticle in accordance with this invention applying to the formation of thin film transistor of liquid crystal display device, wherein a gate electrode, an insulating layer, a semiconductor layer, and a conductive layer are sequentially formed on a substrate.

Referring to FIG. 3, a gate electrode 102, an insulating layer 104, a semiconductor layer 106, and a conductive layer 108 are subsequently formed on an insulate substrate 100. When a back light source is used as light source for liquid crystal display device, the substrate 100 is transparent, such as glass or transparent plastic. When a front light source is used as light source of the display device, the substrate 100 does not necessary be transparent. Material of the gate electrode 102 can be metal or any kind of conductive material, such as aluminum or aluminum alloy, molybdenum or molybdenum tungsten alloy, chromium or tantalum. Formation of the gate electrode 102 is to deposit a conductive layer by using sputtering method on the substrate 100, and a lithographic and etching processes is performed to form gate electrode pattern on the predetermined position. When gate electrode pattern is formed on the substrate 100, gate line (not shown in Figures) is also formed on the substrate 100.

The insulating layer 104, also called gate insulating layer, material of which is silicon nitride, is blanket deposited on the gate electrode 102 and substrate 100. The insulating layer 104 serves as gate dielectric layer of the thin film transistor and provides insulate isolation on the other area. The semiconductor layer 106 primarily provides a channel region of the thin film transistor. In thin film transistor liquid crystal display device, channel region is above the gate electrode 102, and also named back channel region. The semiconductor layer 106 uses a composite layer within double layers, which is underneath amorphous silicon layer and upper n-doped amorphous silicon layer. The underneath amorphous silicon layer provides channel region of the transistor, while the upper n-doped amorphous silicon layer serves as ohmic contact between metal and semiconductor to reduce resistant between metal source/drain and semiconductor layer. Formation of the insulating layer 104 as well as semiconductor layer 106 uses popular chemical vapor deposition method. The conductive layer 108, material of which can be metal or any kind of conductive material, such as aluminum or aluminum alloy, molybdenum or molybdenum tungsten alloy, chromium or tantalum, serves as source/drain regions of the thin film transistor.

Figure 4:
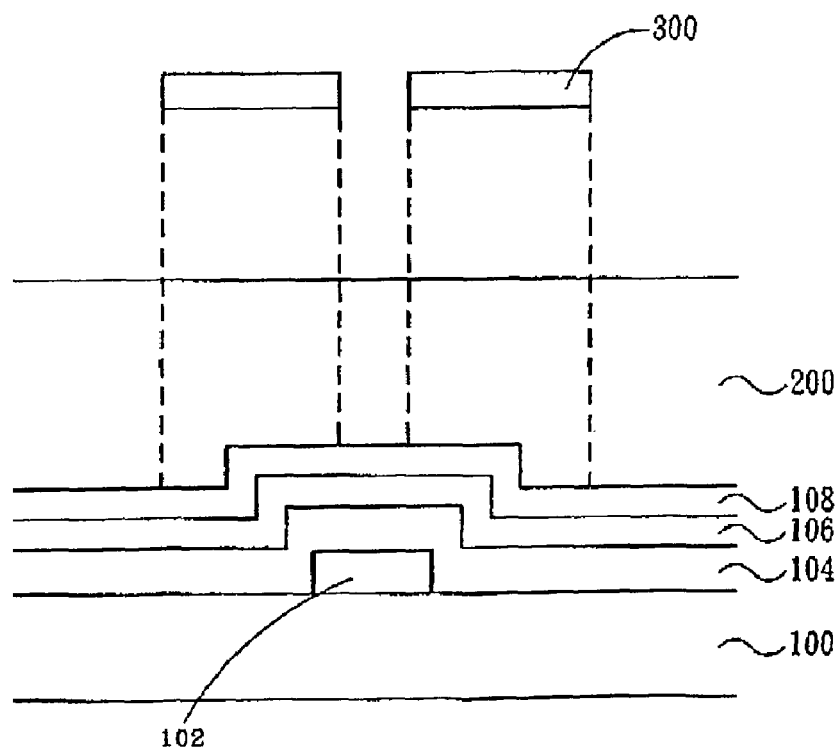
FIG. 4 illustrates a schematic representation of lithographic process for multi-etching steps by using single reticle in accordance with this invention applying to the formation of thin film transistor of liquid crystal display device, wherein a photoresist layer is formed on the conductive layer and exposed by a reticle.

Referring to FIG. 4, a photoresist layer 200 is formed on the conductive layer 108, and exposed by using a reticle 300 without any optical correction. Formation of the photoresist layer 200 can be any kind of coating method. In this embodiment, a positive photoresist layer 200 is used, and thickness of the photoresist layer 200 is between about 2000 to 4000 angstrom. A pre-bake step, or called soft bake, is performed after the photoresist layer 200 is formed on the conductive layer 108 before exposure.

Referring to FIG. 4, a region covered by the reticle 300 is source/drain. Nonetheless, patterns on the reticle 300 can also include another pattern of data lines. Material of the reticle 300 is quartz served as a high transparency region, and metal chromium is used as opaque region of the reticle 300. Light source of the exposure can be i-line, g-line, or k-line, which different light sources will correspond to resolution of varying photoresist development and depth of focus. Intensity and duration of exposure as well affect sensitivity of photoresist, and thickness of the photoresist layer 200 is also included. In this embodiment, exposure intensity can be ranged from 50 to 70 $mJ/cm^2$, and preferred from 58 to 62 $mJ/cm^2$.

Then, the exposed photoresist layer 200 is baked, which is post bake step. In this embodiment, duration of the baking step is ranged from 50 seconds to 170 seconds, and temperature is ranged from 100° C. to 130° C. Temperature of this baking step is higher than the previous soft baking step.

Figure 5:
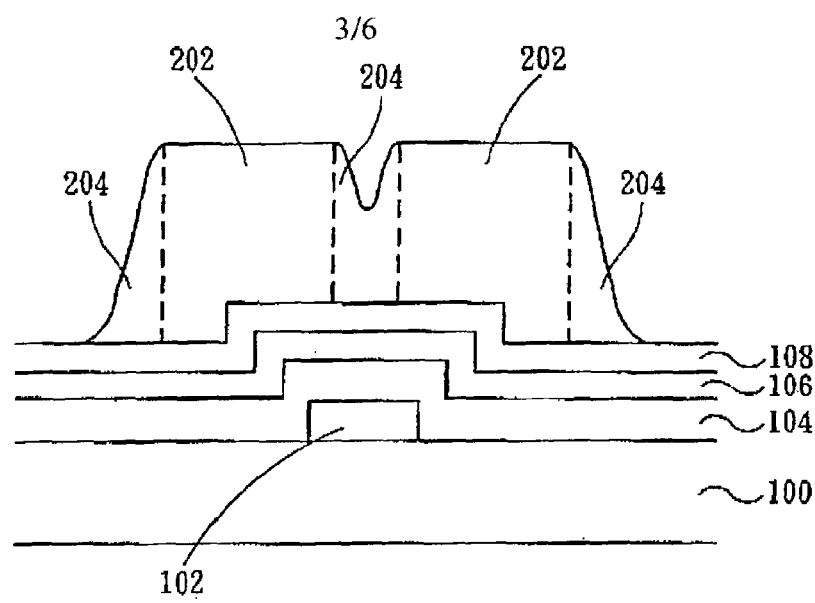
FIG. 5 illustrates a schematic representation of lithographic process for multi-etching steps by using single reticle in accordance with this invention applying to the formation of thin film transistor of liquid crystal display device, wherein photoresist residue is formed around the patterned region after baking and developing.

Referring to FIG. 5, the photoresist layer 200 is developed by using development. The developed photoresist layer 200 has a patterned region 202 and photoresist residue 204. In this embodiment, duration of the develop is between about 60 seconds to 100 seconds, preferred 75 to 90 seconds. Distance between source and drain is short enough in this embodiment, and photoresist residue 204 here will fully cover channel region. The photoresist residue 204 will protect channel region from damaging at following multi-etching steps.

Figure 6:
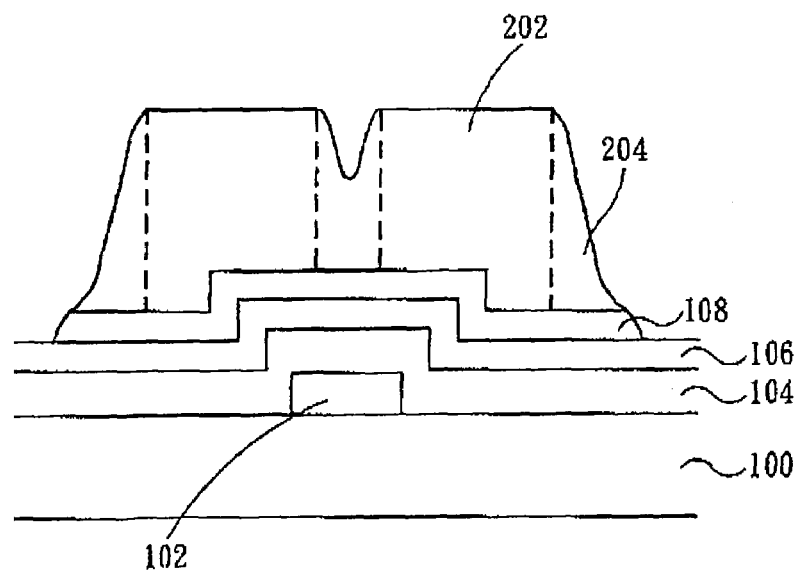
FIG. 6 illustrates a schematic representation of lithographic process for multi-etching steps by using single reticle in accordance with this invention applying to the formation of thin film transistor of liquid crystal display device, wherein a first etching step to the conductive layer is performed.

Referring to FIG. 6, the conductive layer 108 is etched by using the patterned region 202 and photoresist residue 204 as a mask. This etching step should use high etching selectivity ratio process, and general wet etching process is an ideal way. In this embodiment, a suitable etchant for this etching step is a mixture of oxidant, such as $Ce(NH_4)_2(NO_3)_6$, and nitric acids.

Figure 7:
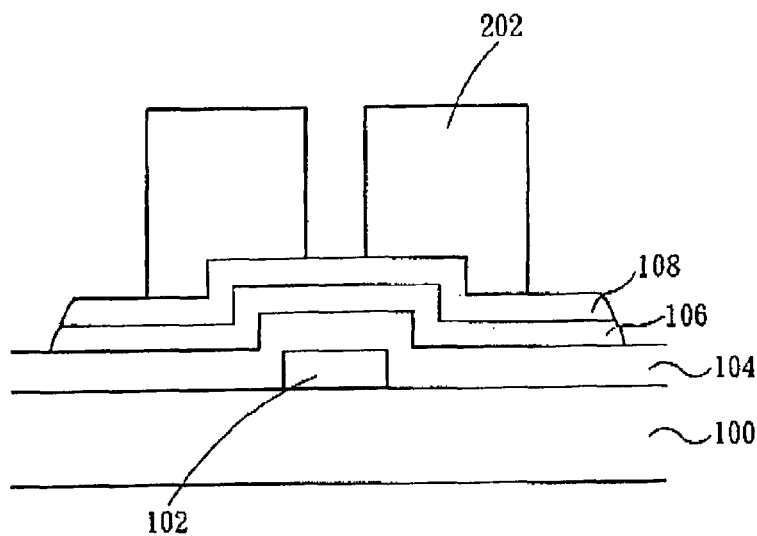
FIG. 7 illustrates a schematic representation of lithographic process for multi-etching steps by using single reticle in accordance with this invention applying to the formation of thin film transistor of liquid crystal display device, wherein a first etching step to the semiconductor layer is performed.

Referring to FIG. 7, the semiconductor layer 106 is etched by using the patterned region 202 and photoresist residue 204 as a mask, and the photoresist residue 204 is also removed at this etching stage. Anisotropical etching step, which can be popular dry etching process, is suitable for this etching step due to photoresist residue 204 should be removed simultaneously. In this embodiment, a suitable etchant for this etching step is $SF_6$—$O_2$ and chlorine plasma. After this etching step, oxygen is introduced into the same chamber to form oxygen plasma to guarantee that photoresist residue 204 is removed completely. Another gas, such as nitrogen with oxygen, or argon plus oxygen, can also be used for the photoresist residue ashing. An island semiconductor region of the thin film transistor is formed in this etching step.

Figure 8:
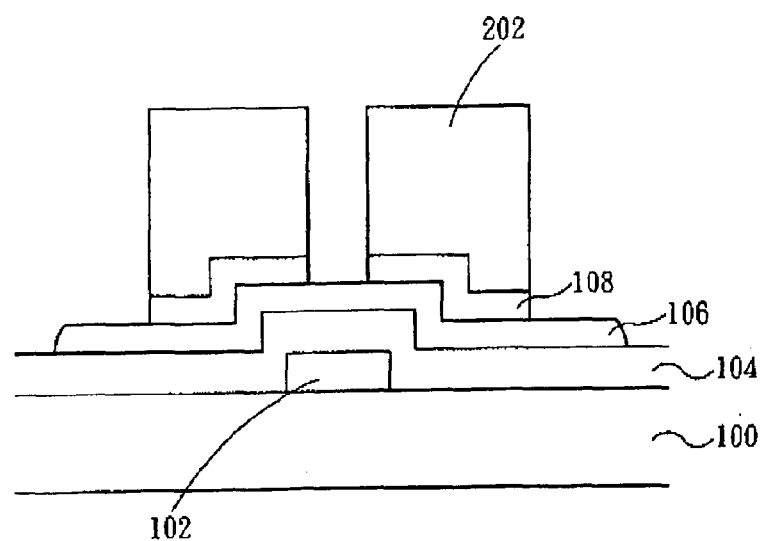
FIG. 8 illustrates a schematic representation of lithographic process for multi-etching steps by using single reticle in accordance with this invention applying to the formation of thin film transistor of liquid crystal display device, wherein a second etching step to the conductive layer is performed.

Referring to FIG. 8, the conductive layer 108 is etched again by using the patterned region 202 as a mask to form source/drain regions. This etching step should use high etching selectivity ratio process, and general wet etching process is an ideal way. In this embodiment, a suitable etchant for this etching step is a mixture of oxidant, such as $Ce(NH_4)_2(NO_3)_6$, and nitric acids.

Figure 9:
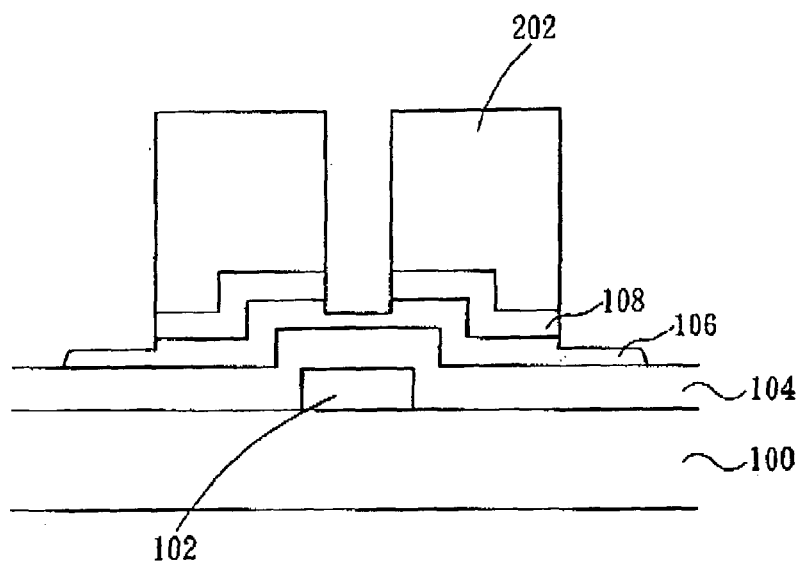
FIG. 9 illustrates a schematic representation of lithographic process for multi-etching steps by using single reticle in accordance with this invention applying to the formation of thin film transistor of liquid crystal display device, wherein a second etching step to the semiconductor layer is performed.

Referring to FIG. 9, the semiconductor layer 106 is etched again by using the patterned region 202 as a mask to form channel region. Both wet etching and dry etching can be applied to this etching step. However, dry etching is preferred in this embodiment. This etching step will remove the n-doped amorphous silicon layer of the semiconductor layer and leave the amorphous silicon layer as channel region of the thin film transistor. In this embodiment, a suitable etchant for this etching step is $SF_6$—$O_2$, hydrogen chloride, and helium plasma.

Figure 10:
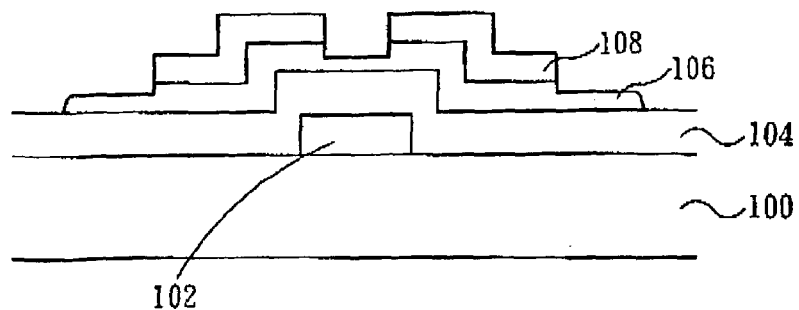
FIG. 10 illustrates a schematic representation of lithographic process for multi-etching steps by using single reticle in accordance with this invention applying to the formation of thin film transistor of liquid crystal display device, wherein the photoresist layer is removed.

Then, patterned region 202 is removed as shown in FIG. 10, and a thin film transistor is formed. Method of removing the patterned region 202 can be conventional wet or dry ashing. The formation of thin film transistors in array is finished, and the following processes include forming passivation layer, contact window, and pixel electrode. These processes can use any conventional method to implement.

Figure 11:
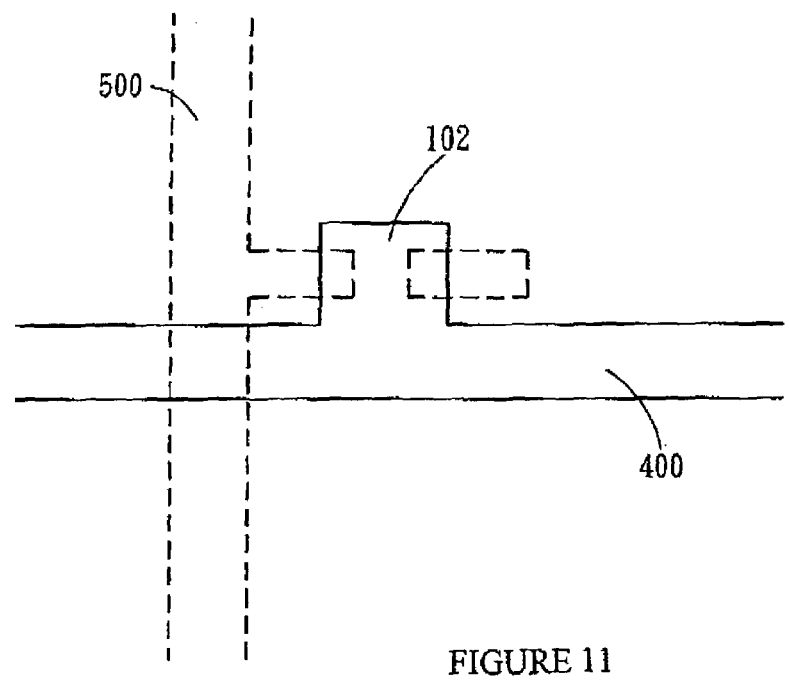
FIG. 11 illustrates a schematic top representation of lithographic process for multi-etching steps by using single reticle in accordance with this invention applying to the formation of thin film transistor of liquid crystal display device, wherein dash line represents pattern on the reticle.

While the lithographic process of this invention applied to the array process, data line can be prevented from opening at the multi-etching process. This advantage will be shown from the top view for convenience. Referring to FIG. 11, a gate line 400, including gate electrode 102, is formed on a substrate. An insulating layer, a semiconductor layer, and a conductive layer are blanket deposited on the gate line 400. These layers can be seen only in the cross sectional view.

Then, photoresist layer is formed on the conductive layer and exposed by a reticle. Dash line shows pattern 500 on the reticle, in which the pattern 500 comprises data line and source/drain regions.

Figure 12:
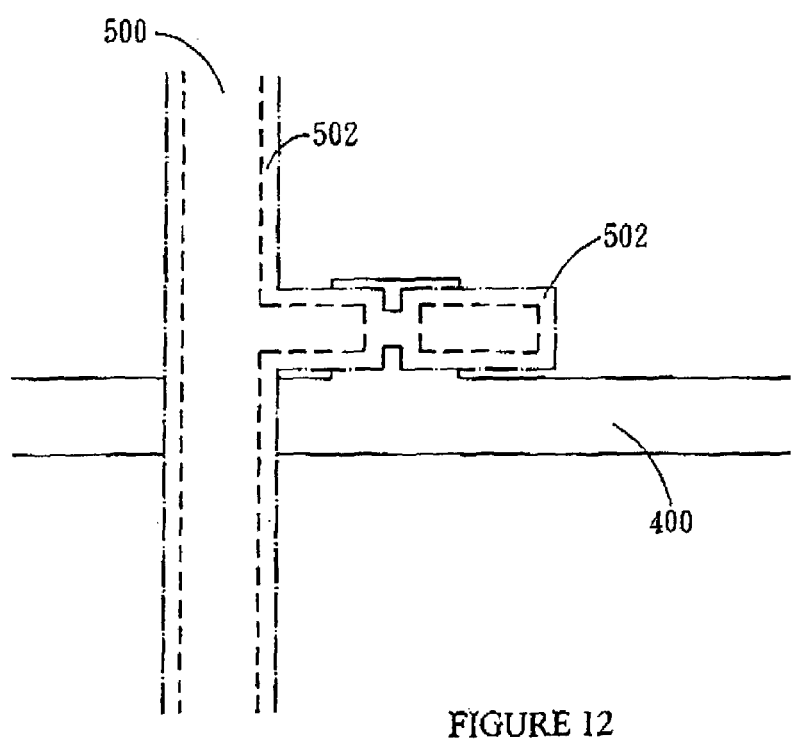
FIG. 12 illustrates a schematic top representation of lithographic process for multi-etching steps by using single reticle in accordance with this invention applying to the formation of thin film transistor of liquid crystal display device, wherein photoresist residue is formed around all patterned regions.

Referring to FIG. 12, photoresist residue 502 is formed around the portion of photoresist layer covered by the pattern 500 while this invention is applied. Photoresist residue 502 will cover channel region of the transistor because distance between source and drain is short. Hence, channel region will be protected by the photoresist residue at the first etching stage. Moreover, there is also photoresist residue 502 around data line, which can not be produced by the conventional optical correction reticle. The photoresist residue 502 here will protect data line from opening for width of the data line will continuously decrease at multi-etching.

This invention provides a lithographic process with a lot of advantages. First, there is no bake step after develop that profile of photoresist layer can be maintained and avoid the following etching steps fail. Further, photoresist residue can be produced by using reticle without any optical correction, which manufacturing cost can be greatly reduced and product yield can be increased. Furthermore, while the lithographic process of this invention is applied to the array process in manufacturing thin film transistor liquid crystal display device, data line can be protected from opening at multi-etching steps.

Although specific embodiments have been illustrated and described, it will be obvious to those skilled in the art that various modifications may be made without departing from what is intended to be limited solely by the appended claims.

We claim:

1. A method for simultaneously forming semiconductor layer and source/drain regions by using a single reticle for multi-etching steps in formation of thin film transistors array, said method comprising:
   providing a substrate;
   selectively forming a gate electrode layer on said substrate;
   subsequently forming a dielectric layer, a semiconductor layer, and a conductive layer on said gate electrode layer and said substrate;
   forming a photoresist layer on said conductive layer;
   exposing said photoresist layer by using said reticle;
   hard baking said photoresist layer;
   developing said photoresist layer after said hard baking such that a patterned photoresist layer covered by said pattern is formed, a photoresist residue around said patterned photoresist layer is formed, and the other region of said photoresist layer is removed;
   first etching said conductive layer by using said patterned photoresist layer and said photoresist residue as an etching mask;
   first etching said semiconductor layer by using said patterned photoresist layer and said photoresist residue as an etching mask and removing said photoresist residue to form an island semiconductor layer;
   second etching said conductive layer to form a source region and a drain region by using said patterned photoresist layer as an etching mask;
   second etching said semiconductor layer to form a channel region by using said patterned photoresist layer as an etching mask; and
   removing said patterned photoresist layer.

2. The method according to claim 1, wherein thickness of said photoresist layer residue is thinner than said patterned photoresist layer.

3. The method according to claim 2, wherein said step of first etching said conductive layer uses a high etching selectivity ratio.

4. The method according to claim 3, wherein said step of first etching said conductive layer utilized wet etching.

5. The method according to claim 3, wherein said step of first etching said semiconductor layer is an anisotropical etching.

6. The method according to claim 5, wherein said anisotropical etching is a dry etching.

7. The method according to claim 6, wherein said photoresist residue is removed by using oxygen plasma.

8. The method according to claim 5, wherein said step of second etching said semiconductor layer uses a high etching selectivity ratio.

9. The method according to claim 8, wherein said step of second etching said semiconductor layer is an anisotropical etching.

10. A method for multi-etching a multi-layer on a substrate, said method comprising:

providing a substrate;

forming a multi-layer including a lower layer, an immediate layer and an upper layer on said substrate;

forming a photoresist layer on said multi-layer;

patterning said photoresist layer so that a patterned photoresist layer is formed on said multi-layer and a photoresist residue is around said patterned photoresist layer;

performing a first etching to said upper layer by using said patterned photoresist layer and said photoresist residue as a first etching mask;

performing a second etching to said immediate layer using said patterned photoresist layer as a second etching mask and removing said photoresist residue; and perfoming a third etching to said lower layer using said patterned photoresist layer as a third etching mask.

11. The method according to claim 10, wherein thickness of said photoresist residue is thinner than said patterned photoresist layer.

* * * * *